(12) United States Patent
Nawata

(10) Patent No.: US 11,584,063 B2
(45) Date of Patent: Feb. 21, 2023

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventor: Ryo Nawata, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 342 days.

(21) Appl. No.: 16/705,514

(22) Filed: Dec. 6, 2019

(65) Prior Publication Data

US 2020/0189175 A1 Jun. 18, 2020

(30) Foreign Application Priority Data

Dec. 12, 2018 (JP) .............................. JP2018-232837

(51) Int. Cl.
| | |
|---|---|
| *B29C 59/02* | (2006.01) |
| *H01L 21/308* | (2006.01) |
| *B29C 43/56* | (2006.01) |
| *B29C 43/58* | (2006.01) |
| *H01L 21/67* | (2006.01) |

(52) U.S. Cl.
CPC ............ *B29C 59/026* (2013.01); *B29C 43/56* (2013.01); *H01L 21/3086* (2013.01); *B29C 2043/5808* (2013.01); *H01L 21/6715* (2013.01)

(58) Field of Classification Search
CPC ................. B29C 59/026; B29C 43/56; B29C 2043/5808
See application file for complete search history.

(56) References Cited

U.S. PATENT DOCUMENTS

| | | |
|---|---|---|
| 8,772,179 B2 | 7/2014 | Fukuhara |
| 8,946,093 B2 | 2/2015 | Mikami |
| 2013/0078821 A1 | 3/2013 | Furutono |

FOREIGN PATENT DOCUMENTS

| | | |
|---|---|---|
| JP | 2013069918 A | 4/2013 |
| JP | 2013069919 A | 4/2013 |
| JP | 2013171950 A | 9/2013 |
| JP | 2016058735 A | 4/2016 |
| JP | 2017139268 A | 8/2017 |
| JP | 2018182300 A | 11/2018 |

OTHER PUBLICATIONS

English language machine translation of JP 2017139268 (Year: 2017).*

* cited by examiner

*Primary Examiner* — Larry W Thrower
(74) *Attorney, Agent, or Firm* — Rossi, Kimms & McDowell LLP

(57) ABSTRACT

An imprint method includes contact step of bringing imprint material on shot region of substrate and pattern region of mold into contact with each other, alignment step of aligning the shot region and the pattern region after the contact step, first irradiation step of, before the alignment step is completed, irradiating frame-shaped portion of the imprint material with light, second irradiation step, started after the first irradiation step is started, irradiating at least part of the imprint material on the shot region with light under condition different from condition in the first irradiation step so that alignment error between the shot region and the pattern region is reduced, third irradiation step of irradiating the entire imprint material on the shot region with light after the alignment step is completed.

15 Claims, 10 Drawing Sheets

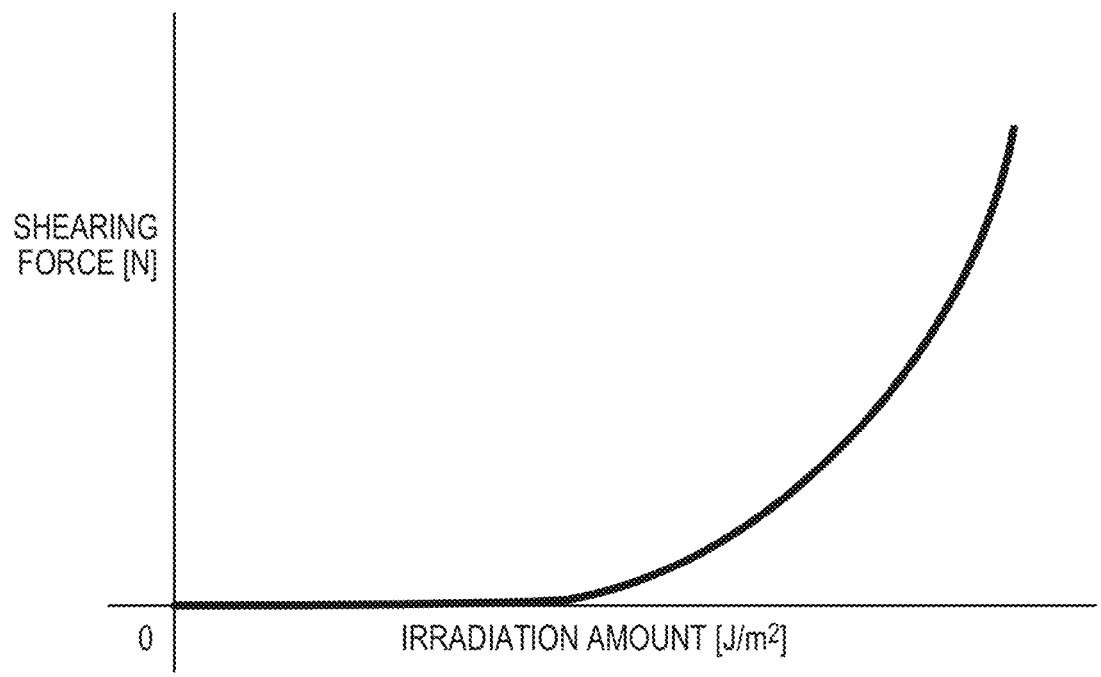

FIG. 9

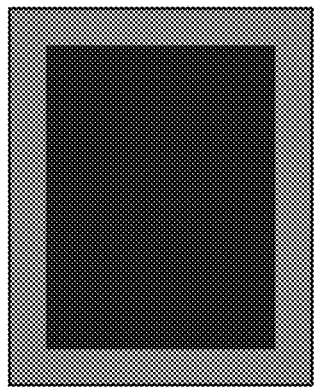 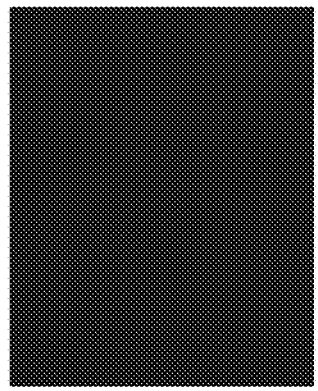 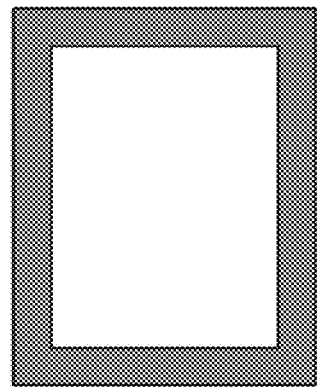

IRRADIATION AMOUNT DISTRIBUTION IN PRELIMINARY EXPOSURE

TARGET IRRADIATION AMOUNT DISTRIBUTION AT TIME OF COMPLETION OF PRELIMINARY EXPOSURE

IRRADIATION AMOUNT DISTRIBUTION IN FRAME EXPOSURE

FIG. 10A

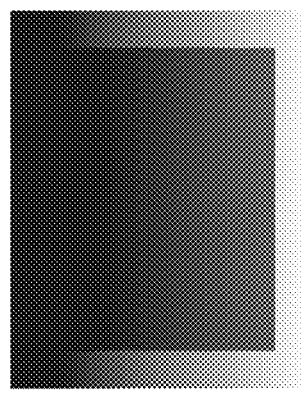

FIG. 10B

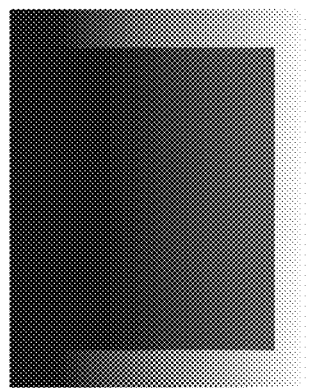 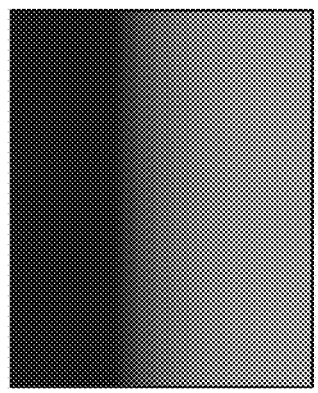 —α× 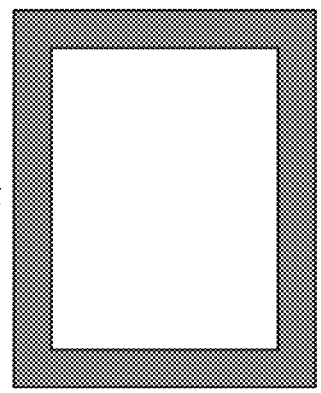

IRRADIATION AMOUNT DISTRIBUTION IN HEAT EXPOSURE

TARGET IRRADIATION AMOUNT DISTRIBUTION AT TIME OF COMPLETION OF HEAT EXPOSURE

IRRADIATION AMOUNT DISTRIBUTION IN FRAME EXPOSURE

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

There is known an imprint technique of arranging an imprint material on the shot region of a substrate, bringing the imprint material and the pattern region of a mold into contact with each other, and then curing the imprint material, thereby forming a pattern formed by the cured product of the imprint material on the substrate. In such an imprint technique, the imprint material can protrude from the shot region when the imprint material and the pattern region of the mold are brought into contact with each other. Japanese Patent Laid-Open No. 2013-69918 describes a method including a first curing step of, when a template pattern is pressed against a resist on a substrate, curing the resist, which otherwise protrudes outside an imprint shot, by irradiating a light irradiation region outside the imprint shot with light. This method further includes a filling step of filling the template pattern with the resist after the first curing step, and a second curing step of curing the entire resist.

In an imprint apparatus, since a substrate is supported by a substrate positioning mechanism and a mold is supported by a mold positioning mechanism, the substrate and the mold can vibrate independently of each other. Therefore, there is a relative vibration between the substrate and the mold, and this can be a cause of hindering improvement in alignment accuracy between the substrate (shot region thereof) and the mold (pattern region thereof). In another aspect, there is a shape difference between the shot region of the substrate and the pattern region of the mold, and this shape difference can also be a cause of hindering improvement in alignment accuracy between the substrate (shot region thereof) and the mold (pattern region thereof). In patent literature 1, improvement in alignment accuracy is not considered.

SUMMARY OF THE INVENTION

The present invention provides a technique advantageous in improving alignment accuracy between the shot region of a substrate and the pattern region of a mold while suppressing protrusion of an imprint material from the shot region.

One of aspects of the present invention provides an imprint method comprising: a contact step of bringing an imprint material on a shot region of a substrate and a pattern region of a mold into contact with each other; an alignment step of aligning the shot region and the pattern region after the contact step; a first irradiation step of, before the alignment step is completed, irradiating a frame-shaped portion of the imprint material on the shot region with light, the frame-shaped portion being located on a frame-shaped region formed by a peripheral region in the shot region; a second irradiation step, started after the first irradiation step is started, irradiating at least a part of the imprint material on the shot region with light under a condition different from a condition in the first irradiation step so that an alignment error between the shot region and the pattern region is reduced; a third irradiation step of irradiating the entire imprint material on the shot region with light after the alignment step is completed.

Further features of the present invention will become apparent from the following description of exemplary embodiments with reference to the attached drawings.

BRIEF DESCRIPTION OF THE DRAWINGS

FIG. 8 is a graph exemplarily showing the relationship between a light irradiation amount with respect to an imprint material and the shearing force of the imprint material that changes accordingly;

FIG. 9 is a view schematically and exemplarily showing a method of determining a light irradiation amount distribution with respect to the imprint material in a second irradiation step (preliminary exposure);

FIG. 10A is a view exemplarily showing a light irradiation amount distribution with respect to an imprint material in a second irradiation step (heat exposure);

FIG. 10B is a view schematically and exemplarily showing a method of determining the light irradiation amount distribution with respect to the imprint material in the second irradiation step (heat exposure)

DESCRIPTION OF THE EMBODIMENTS

Exemplary embodiments of the present invention will be described below with reference to the accompanying drawings.

Figure 1:
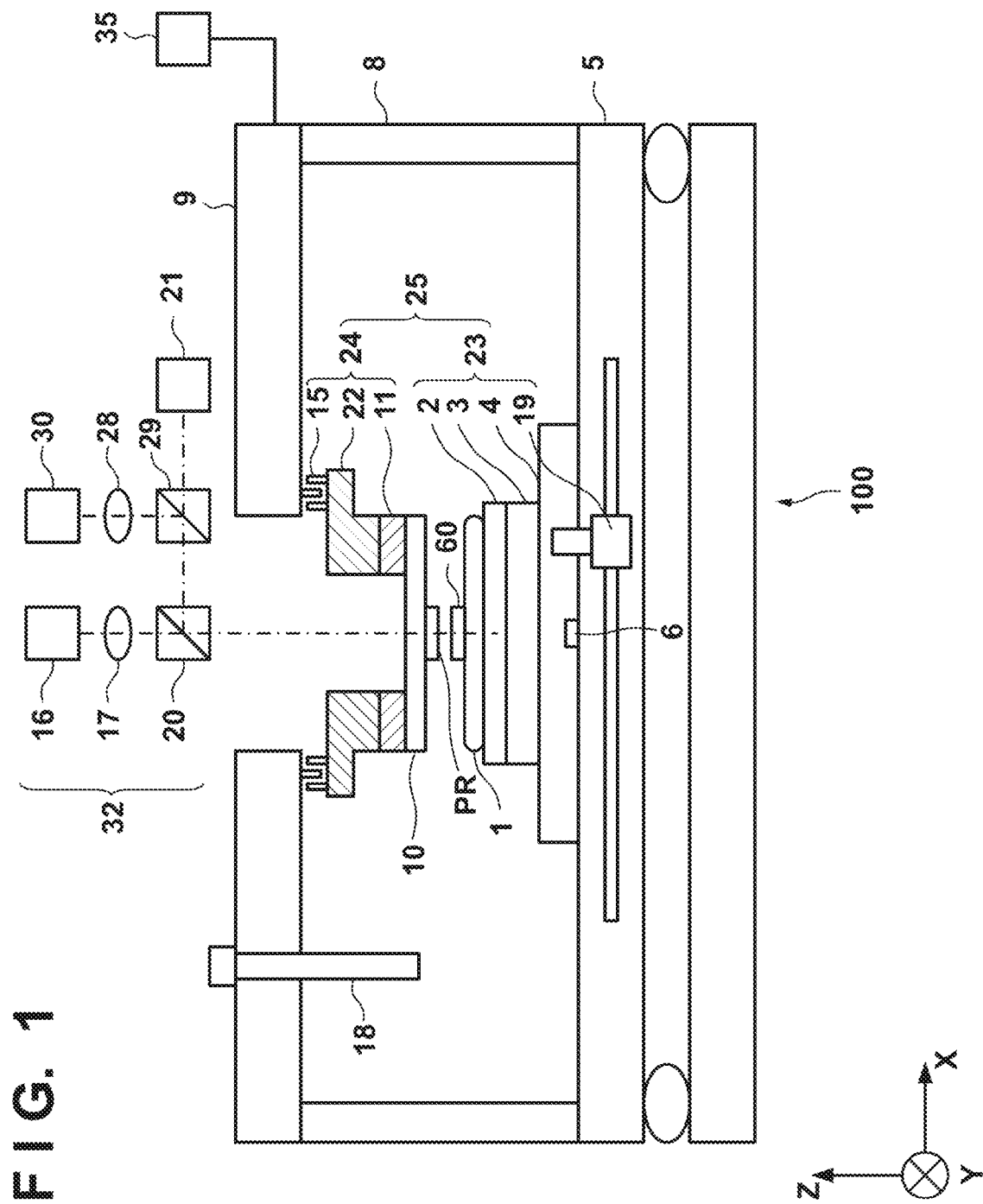
FIG. 1 is a view exemplarily showing the arrangement of an imprint apparatus according to the first embodiment of the present invention.

FIG. 1 shows the arrangement of an imprint apparatus 100 according to the first embodiment of the present invention. The imprint apparatus 100 brings an imprint material 60 arranged on the shot region of a substrate 100 and a pattern region PR of a mold 10 into contact with each other and cures the imprint material 60, thereby forming a pattern formed by the cured product of the imprint material 60 on the substrate 1. In the specification and the accompanying drawings, directions will be indicated by an XYZ coordinate system in which directions parallel to the surface of the substrate 1 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment can include control of the position and/or orientation of at least one of the substrate 1 and the mold 10. Alignment can further include control for correcting or changing the shape of at least one of the substrate 1 and the mold 10.

The imprint apparatus 100 can include a relative driving mechanism 25, a supplier (dispenser) 18, a light irradiator 32, an image capturing device 21, a controller 35, a base 5, a column 8, and a top plate 9. The light irradiator 32 irradiates the imprint material 60 on the shot region of the substrate 1 with light. When the light irradiator 32 irradiates the imprint material 60 with light, it can irradiate the substrate 1 with the light via the imprint material 60. The relative driving mechanism 25 can relatively drive the substrate 1 and the mold 10 so as to change the relative position between the substrate 1 (shot region thereof) and the mold 10 (pattern region PR thereof). The relative driving mechanism 25 can include a substrate positioning mechanism 23 and a mold positioning mechanism 24.

The substrate positioning mechanism 23 can include, for example, a substrate chuck 2 that holds (chucks) the substrate 1, a θ stage 3 that drives the substrate chuck 2 with respect to the θZ-axis, and an X-Y stage 4 that supports the θ stage 3. The substrate positioning mechanism 23 can include an actuator 19 (for example, a linear motor) for driving the X-Y stage 4 with respect to the X- and Y-axes. The imprint apparatus 100 can include a measuring device 6 (for example, a linear encoder) that measures the relative position of the X-Y stage 4 with respect to the base 5. The top plate 9 can be supported by, for example, the base 5 via the column 8. The substrate positioning mechanism 23 can drive the substrate 1 with respect to the X-, Y-, and θZ-axes by the above-described components. The substrate positioning mechanism 23 may be further configured to drive the substrate 1 with respect to the θX- and θY-axes.

As the material of the substrate 1, glass, ceramic, a metal, a semiconductor, a resin, or the like can be used, for example. A member made of a material different from that of the substrate may be formed on the surface of the substrate 1, as needed. The substrate 1 is, for example, a silicon wafer, a semiconductor compound wafer, silica glass, and the like. The substrate 1 can include one or a plurality of shot regions.

As the imprint material, a curable composition (to be also referred to as a resin in an uncured state) to be cured by receiving curing energy is used. As the curing energy, an electromagnetic wave or the like can be used. As the electromagnetic wave, for example, light selected from the wavelength range of 10 nm (inclusive) to 1 mm (inclusive) is used. The electromagnetic wave can be ultraviolet light or the like. The curable composition can be a composition cured with light irradiation. The photo-curable composition cured with light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. In this embodiment, as an example, a photo-curable composition cured by ultraviolet light is used as the imprint material 60. The imprint material 60 can be arranged on the substrate 1 in the form of droplets or in the form of an island or film obtained by connecting a plurality of droplets supplied by the supplier 18. The viscosity (the viscosity at 25° C.) of the imprint material can be, for example, 1 mPa·s (inclusive) to 100 mPa·s (inclusive).

The supplier (dispenser) 18 supplies or arranges the imprint material 60 onto the respective shot regions of the substrate 1. The supplier 18 includes, for example, a discharge port (not shown) for discharging the imprint material 60, and supplies the imprint material 60 onto the substrate 1 by discharging the imprint material 60 from the discharge port. The supplier 18 can arrange, for example, droplets of the imprint material 60 on the substrate 1. The amount of the imprint material 60 supplied onto the substrate 1 by the supplier 18 can be determined in accordance with the requested thickness of the imprint material 60, the density of the pattern to be formed, and the like.

The mold 10 includes, for example, a rectangular outer peripheral portion, and can include the pattern region PR on the surface facing the substrate 1. A pattern to be transferred to the imprint material 60 arranged on the substrate 1 is formed in the pattern region PR. The mold 10 can include a mesa protruding from the peripheral portion, and the pattern region PR can be arranged on the mesa. The protruding amount of the mesa from the peripheral portion can be, for example, in a range between several ten m and several hundred μm. The mold 10 can be made of, for example, a material such as quartz that transmits light (for example, ultraviolet light) that can be generated by the light irradiator 32.

The mold positioning mechanism 24 can include a mold chuck 11 that holds (chucks) the mold 10, a mold stage 22 that holds the mold chuck 11, and an actuator (for example, a linear actuator) 15 that drives the mold stage 22. The mold chuck 11 can hold the mold 10 by a holding force such as a vacuum suction force or electrostatic suction force. The mold chuck 11 can be held by the mold stage 22. The mold stage 22 can be configured to drive the mold 10 with respect to, for example, the Z-, θX-, and θY-axes. The actuator 15 drives the mold stage 22 with respect to the Z-axis so that it can bring the mold 10 into contact with the imprint material 60 arranged on the substrate 1, and separate the mold 10 from the cured imprint material 60 on the substrate 1. The actuator 15 is, for example, an air cylinder or a linear motor. Each of the mold chuck 11 and the mold stage 22 can include a window or an opening through which light provided from the light irradiator 32 passes.

The light irradiator 32 can be configured to perform first irradiation (frame exposure or frame cure), second irradiation (preliminary exposure), and third irradiation (main exposure). The first irradiation (frame exposure) can be an operation of irradiating, with light, the frame-shaped portion of the imprint material 60 on the shot region of the substrate 1. The frame-shaped portion is a portion of the imprint material 60 on the shot region of the substrate 1, the portion being located on the frame-shaped region formed by the peripheral region in the shot region of the substrate 1. The second irradiation (preliminary exposure) can be an operation of irradiating, with light, at least a part of the imprint material 60 on the shot region under a condition different from the condition in the first irradiation so that the alignment error between the shot region of the substrate 1 and the pattern region PR of the mold 10 is reduced. The third irradiation (main exposure) can be an operation of irradiating, with light, the entire imprint material 60 on the shot region of the substrate 1. With the third irradiation, the imprint material 60 is set in a state in which the imprint material 60 can be separated from the mold 10, that is, the imprint material 60 is sufficiently cured.

In one example, the light irradiator 32 can include a first light source 16, a second light source 30, a first optical system 17, a second optical system 28, a first beam splitter 20, and a second beam splitter 29. The first light source 16 can be used, for example, in the third irradiation (main exposure). Light from the first light source 16 can be applied to the imprint material 60 on the substrate 1 via, for example, the first optical system 17 and the first beam splitter 20 to cure the imprint material 60. For example, the first light source 16 can be configured to generate ultraviolet light. In one example, the first light source 16 can generate light (an i-line) having a wavelength of 365 nm.

The second light source 30 can be used, for example, in the first irradiation (frame exposure) and the second irradiation (preliminary exposure). Light from the second light source 30 can be applied to the imprint material 60 on the substrate 1 via, for example, the second optical system 28, the second beam splitter 29, and the first beam splitter 20. For example, the second light source 30 can be configured to generate ultraviolet light. In one example, the second light source 30 can generate light having a wavelength of 405 nm.

Light used in a first irradiation step of performing the first irradiation (frame exposure) and light used in a third irradiation step of performing the third irradiation (main exposure) can be different from each other in at least one of a wavelength band and intensity distribution. Light used in the first irradiation step of performing the first irradiation (frame exposure) and light used in a second irradiation step of performing the second irradiation (preliminary exposure) have a same wavelength band. In the first irradiation step, the second irradiation step, and the third irradiation step, light irradiation regions can be different from each other.

For example, the image capturing device 21 can capture, via the second beam splitter 29 and the first beam splitter 20, an image formed by the contact between the imprint material 60 on the substrate 1 and the pattern region PR of the mold 10. The controller 35 can be configured to control the relative driving mechanism 25, the supplier (dispenser) 18, the light irradiator 32, and the image capturing device 21. The controller 35 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components.

Figure 2:
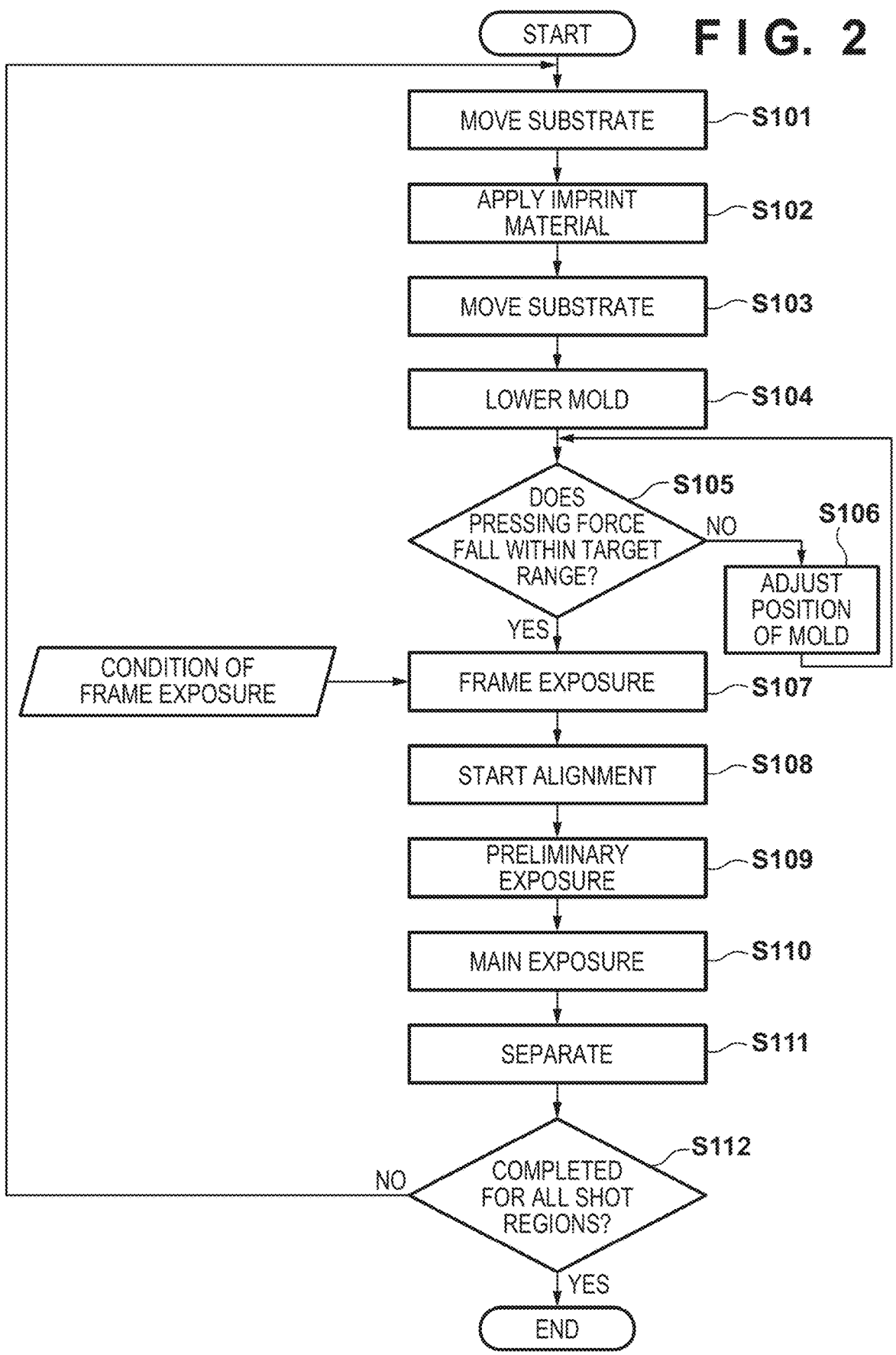
FIG. 2 is a view exemplarily showing the operation of the imprint apparatus according to the first embodiment of the present invention.

FIG. 2 exemplarily shows the operation of the imprint apparatus 100. The processing shown in FIG. 2 is controlled by the controller 35. In step S101, the controller 35 controls the relative driving mechanism 25 (the X-Y stage 4 of the substrate positioning mechanism 23) so that the pattern formation target shot region is positioned at a position where the supplier 18 starts processing of supplying the imprint material 60 onto the pattern formation target shot region. In step S102, the controller 35 controls the X-Y stage 4 and the supplier 18 so that the imprint material 60 is supplied onto the pattern formation target shot region of the substrate 1 by the supplier 18 while moving the substrate 1. Thus, the imprint material 60 is arranged on the pattern formation target shot region of the substrate 1.

In step S103, the controller 35 controls the relative driving mechanism 25 (the X-Y stage 4 of the substrate positioning mechanism 23) so that the pattern formation target shot region with the imprint material 60 arranged thereon is positioned at a position where the pattern formation target shot region faces the pattern region PR of the mold 10. Further, in step S103, the controller 35 can control the θ stage 3, as needed, so that the rotation error (rotation error with respect to the θZ axis) between the pattern formation target shot region and the pattern region PR of the mold 10 is reduced.

In step S104, the controller 35 controls the relative driving mechanism 25 (actuator 15) so as to start lowering of the mold 10 so that the imprint material 60 on the pattern formation target shot region of the substrate 1 and the pattern region PR of the mold 10 come into contact with each other. In step S105, the controller 35 acquires the pressing force of the mold 10 against the imprint material 60 on the pattern formation target shot region of the substrate 1, and determines whether the pressing force falls within a target range. If the pressing force falls outside the target range, the controller 35 controls the relative driving mechanism 25 in step S106 so that the pressing force falls within the target range. Here, the pressing force can be acquired by the controller 35 based on the output of one or a plurality of load cells (sensors) incorporated in the mold chuck 11 or the mold stage 22, for example. The operation to keep the pressing force within the target range includes at least one of driving of the mold 10 in the Z-axis direction by the actuator 15 and driving of the mold 10 with respect to the θX-axis and θY-axis by the mold stage 22.

If the pressing force falls within the target range, step S107 is performed. In step S107, the controller 35 controls the light irradiator 32 so that the first irradiation step (frame exposure) is performed. That is, in step S107, the controller 35 controls the light irradiator 32 so that the frame-shaped portion of the imprint material 60 on the shot region of the substrate 1 is irradiated with light. More specifically, the controller 35 controls the light irradiator 32 so that the frame-shaped portion of the imprint material 60 on the shot region of the substrate 1 is irradiated with light from the second light source 30. The frame-shaped region (a peripheral region in the shot region) of the shot region corresponding to the frame-shaped portion of the imprint material 60 can be a region including a kerf portion. When the frame-shaped portion of the imprint material 60 on the shot region of the substrate 1 is irradiated with light, the frame-shaped portion is cured to the degree of polymerization corresponding to the light irradiation amount. Accordingly, it is possible to suppress the intrusion of the imprint material 60 into the shot region adjacent to the current pattern formation target shot region. A frame exposure condition can be set in advance, and the controller 35 can perform the first irradiation step (frame exposure) in accordance with the condition.

In step S108, the controller 35 controls the relative driving mechanism 25 so as to start the operation of aligning the pattern formation target shot region of the substrate 1 and the pattern region PR of the mold 10. In this operation, while detecting the relative position between the alignment mark on the substrate 1 and the alignment mark on the mold 10 using an alignment scope (not shown), the pattern formation target shot region and the pattern region PR are aligned with each other based on the detection result. Here, step S107 (first irradiation step; frame exposure) can be performed before the alignment step started in step S108 is completed.

In step S109, the controller 35 controls the light irradiator 32 so that the second irradiation step (preliminary exposure) is performed. That is, in step S109, the controller 35 controls the light irradiator 32 so that at least a part of the imprint material 60 on the shot region is irradiated with light to reduce the alignment error between the shot region of the substrate 1 and the pattern region PR of the mold 10. Step S109 (second irradiation step (preliminary exposure)) can be performed under a condition different from the condition in step S107 (first irradiation step (frame exposure)). More specifically, the controller 35 controls the light irradiator 32 so that at least a part of the imprint material 60 on the shot region of the substrate 1 is irradiated with light from the second light source 30. With this processing, the coupling force by the imprint material 60 between the substrate 1 and the mold 10 becomes high, and the relative vibration between the substrate 1 and the mold 10 can be reduced. Therefore, the alignment between the pattern formation target shot region of the substrate 1 and the pattern region PR of the mold 10 can be facilitated, and the alignment accuracy can be improved.

In step S109 (second irradiation step), the pattern formation target shot region of the substrate may be irradiated with light only partly or entirely. In step S109 (second irradiation step), at least a part of the imprint material 60 on the pattern formation target shot region of the substrate 1 can be cured to target hardness. Alternatively, in step S109 (second irradiation step), at least a part of the imprint material 60 can be cured to target hardness so that the relative vibration between the substrate 1 and the mold 10 falls within the range of target maximum vibration. Here, step S109 (second irradiation step; preliminary exposure) can be started after step S107 (first irradiation step; frame exposure) is started.

After the alignment step started in step S108 is completed, the controller 35 controls the light irradiator 32 in step S110 so that the third irradiation step (main exposure) is performed. That is, in step S110, the controller 35 controls the light irradiator 32 so that the entire imprint material 60 on the shot region of the substrate 1 is irradiated with light. This irradiation is performed so that the imprint material 60 is cured to a state in which the imprint material 60 can be separated from the mold 10. More specifically, the controller 35 controls the light irradiator 32 so that the entire imprint material 60 on the shot region of the substrate 1 is irradiated with light from the first light source 16. The light irradiation amount distribution with respect to the imprint material 60 in step S110 (third irradiation step; main exposure) can be determined based on the light irradiation amount distribution in step S107 (first irradiation step; frame exposure) and the light irradiation amount distribution in step S109 (second irradiation step; preliminary exposure).

Thereafter, in step S111, the controller 35 controls the relative driving mechanism 25 so that the imprint material 60 on the pattern formation target shot region of the substrate 1 is separated from the mold 10 (pattern region PR thereof). More specifically, the controller 35 controls the actuator 15 of the relative driving mechanism 25 so as to lift the mold 10 (mold stage 22). A pattern formed by the cured imprint material 60 remains on the pattern formation target shot region of the substrate 1.

In step S112, the controller 35 determines whether the above-described processing has been completed for all the shot regions of the substrate 1, and if there is an unprocessed shot region, the processing in steps S101 to S111 has been performed for the unprocessed shot region. On the other hand, if the above-described processing is completed for all the shot regions of the substrate 1, the controller 35 unloads the substrate 1 and terminates the processing for the substrate 1.

In the above example, the same light source (second light source 30) is used in step S107 (first irradiation step; frame exposure) and step S109 (second irradiation step; preliminary exposure), but different light sources may be used. Further, in the above example, different light sources (first light source 16 and second light source 30) are used in step S109 (second irradiation step; preliminary exposure) and step S110 (third irradiation step; main exposure), but the same light source may be used.

Figure 3:
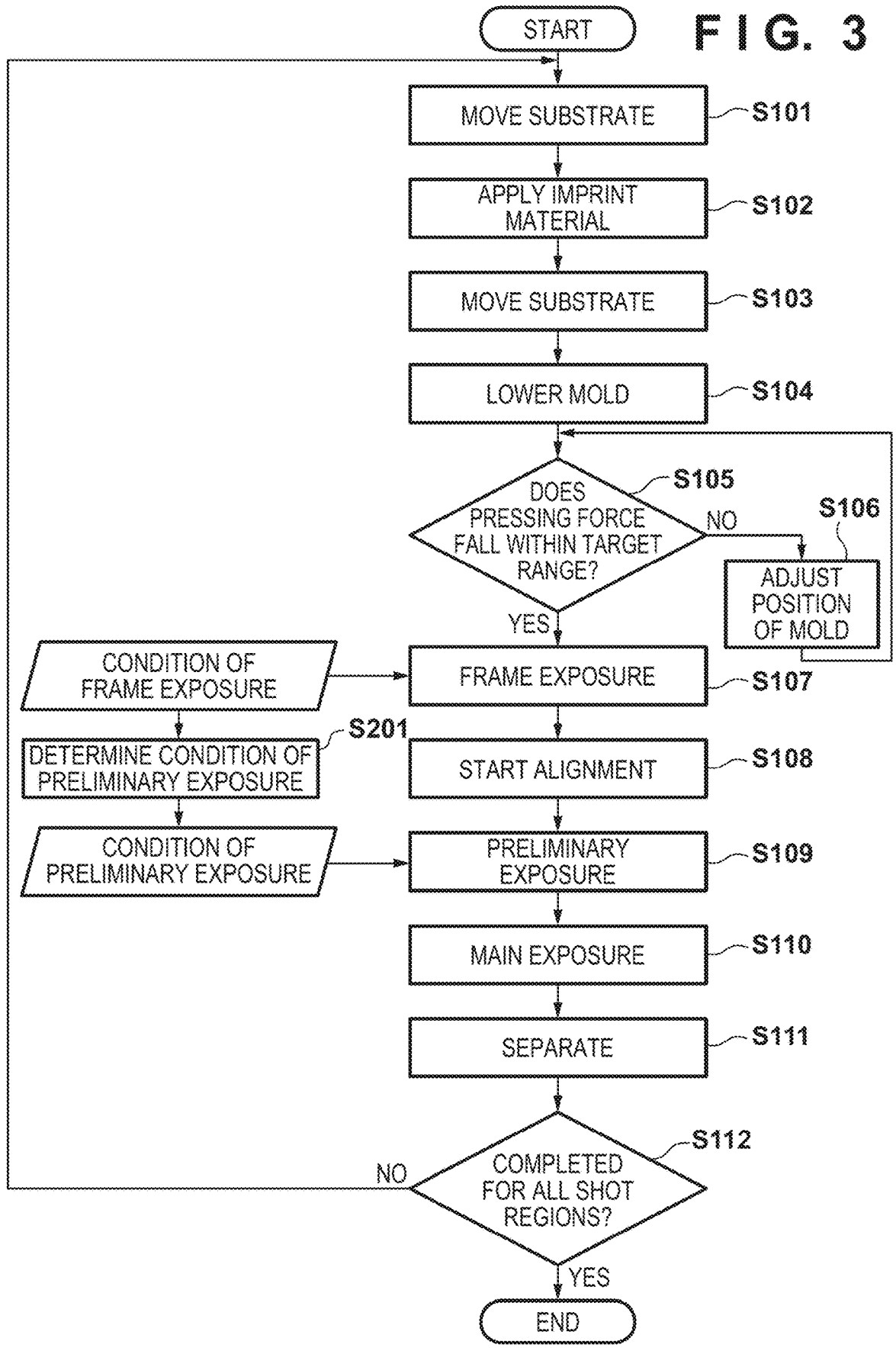
FIG. 3 is a view exemplarily showing the operation of an imprint apparatus according to the second embodiment of the present invention.

The second embodiment of the present invention will be described below with reference to FIG. 3. Matters not mentioned as the second embodiment can follow the first embodiment. In the second embodiment, step S201 of determining the condition (preliminary exposure condition) in step S109 (second irradiation step; preliminary exposure) is added to the operation of the imprint apparatus 100 according to the first embodiment.

If the energy applied to an imprint material 60 in step S109 (second irradiation step; preliminary exposure) is excessive, the viscoelasticity of the imprint material 60 becomes too high, and the alignment accuracy between a substrate 1 and a mold 10 thereafter can be decreased. On the other hand, if the energy applied to the imprint material 60 in step S109 (second irradiation step; preliminary exposure) is insufficient, the viscoelasticity of the imprint material 60 does not become sufficiently high. In this state, the relative vibration between the substrate 1 and the mold 10 is large, and the alignment accuracy between the substrate 1 and the mold 10 does not increase. Accordingly, step S110 (third irradiation step; main exposure) can be performed in a state in which the alignment accuracy between the substrate 1 and the mold 10 is low. Therefore, in the second embodiment, in step S201, a controller 35 can determine the condition (for example, the light irradiation amount distribution) in step S109 (second irradiation step; preliminary exposure) in accordance with the condition (for example, the light irradiation amount distribution with respect to the frame-shaped portion) in step S107 (first irradiation step; frame exposure). For example, the controller 35 can determine the light irradiation amount distribution with respect to the imprint material 60 in step S109 (second irradiation step; preliminary exposure) based on the light irradiation amount distribution with respect to the frame-shaped portion of the imprint material 60 in step S107 (first irradiation step; frame exposure).

FIG. 8 is a graph exemplarily showing the relationship between a light irradiation amount with respect to the imprint material 60 and the shearing force of the imprint material 60 that changes accordingly. A shearing force has a correlation with viscoelasticity. Therefore, the irradiation amount (irradiation amount distribution) corresponding to the target shearing force can be determined from the graph shown in FIG. 8.

FIG. 9 schematically and exemplarily shows a method of determining, in step S201, the light irradiation amount distribution with respect to the imprint material in step S109 (second irradiation step; preliminary exposure). The controller 35 can determine the light irradiation amount distribution with respect to the imprint material in step S109 (second irradiation step; preliminary exposure) based on the target irradiation amount distribution at the time of completion of step S109 and the light irradiation amount distribution with respect to the frame-shaped portion in step S107 (first irradiation step; frame exposure). More specifically, the controller 35 can determine the light irradiation amount distribution with respect to the imprint material in step S109 based on the difference between the target irradiation amount distribution at the time of completion of step S109 and the light irradiation amount distribution with respect to the imprint material in step S107. With this operation, regardless of the condition in step S107, the irradiation amount distribution in accordance with the target irradiation amount distribution can be obtained when step S109 is completed.

Here, the light irradiation amount distribution $E_c(i, j)$ with respect to the imprint material in step S109 (second irradiation step; preliminary exposure) can be given by equation (1). $E_{cref}(i, j)$ is the target irradiation amount distribution at the time of completion of step S109. $E_f(i, j)$ is the light irradiation amount distribution with respect to the imprint material in step S107 (first irradiation step; frame exposure). (i, j) is an XY coordinate.

$$E_c(i,j) = E_{cref}(i,j) - E_f(i,j) \tag{1}$$

Figure 4:
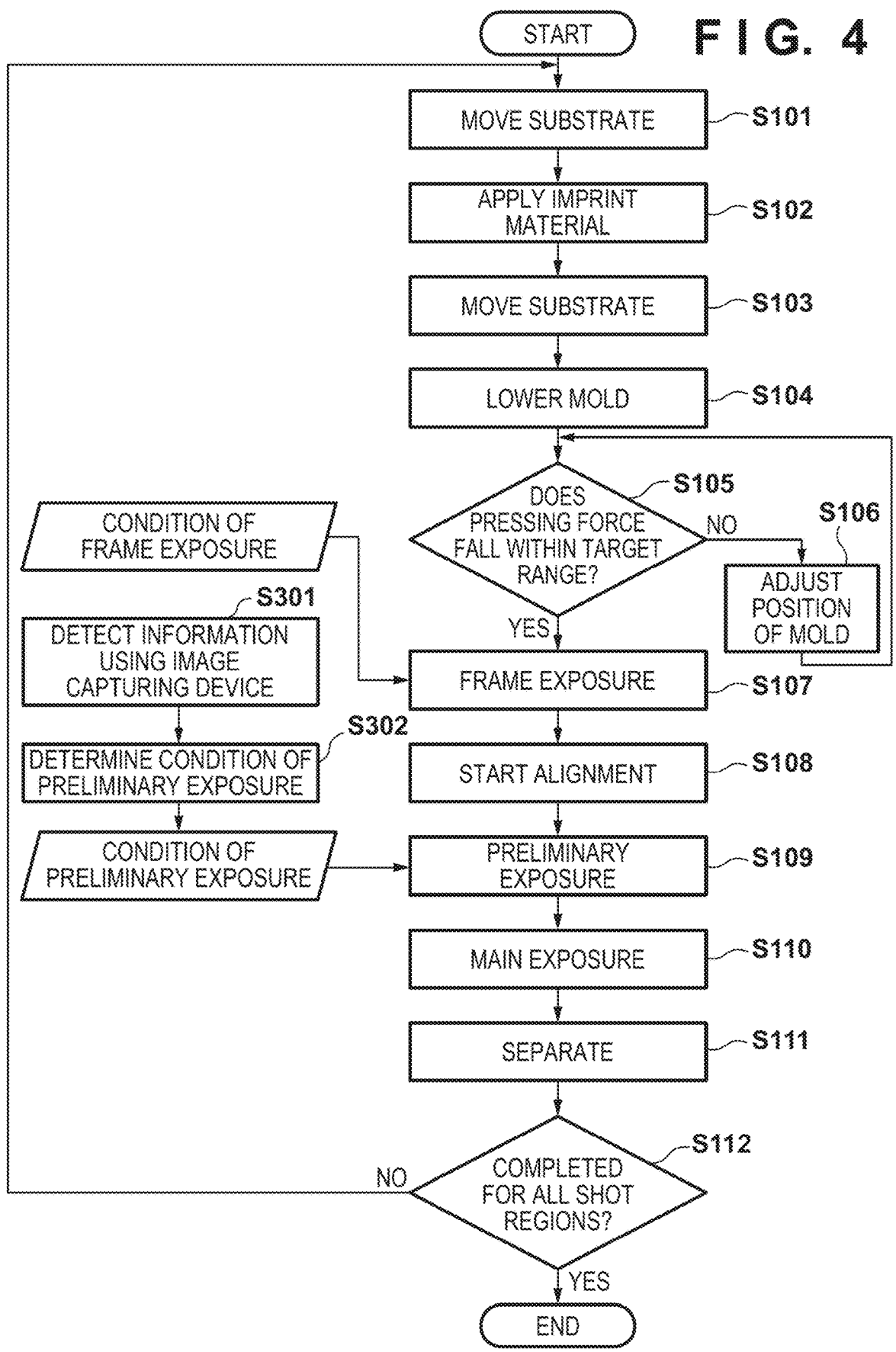
FIG. 4 is a view exemplarily showing the operation of an imprint apparatus according to the third embodiment of the present invention.

The third embodiment of the present invention will be described with reference to FIG. 4. Matters not mentioned as the third embodiment can follow the first embodiment. The relative vibration between the substrate 1 and the mold 10 can change depending on, for example, individual differences between a plurality of substrates 1, individual differences between a plurality of molds 10, and an environment at the time of pattern formation (for example, temperature, humidity, oxygen concentration, rare gas concentration, or the like). Thus, in the third embodiment, steps S301 and S302 for determining the condition (preliminary exposure condition) in step S109 (second irradiation step; preliminary exposure) are added to the operation of the imprint apparatus 100 according to the first embodiment. In step S301, for example, a controller 35 can determine the light irradiation amount distribution with respect to an imprint material 60 in step S109 based on the information measured using an image capturing device 21 within a predetermined time period after the completion of step S107 (first irradiation step; frame exposure).

Figure 5:
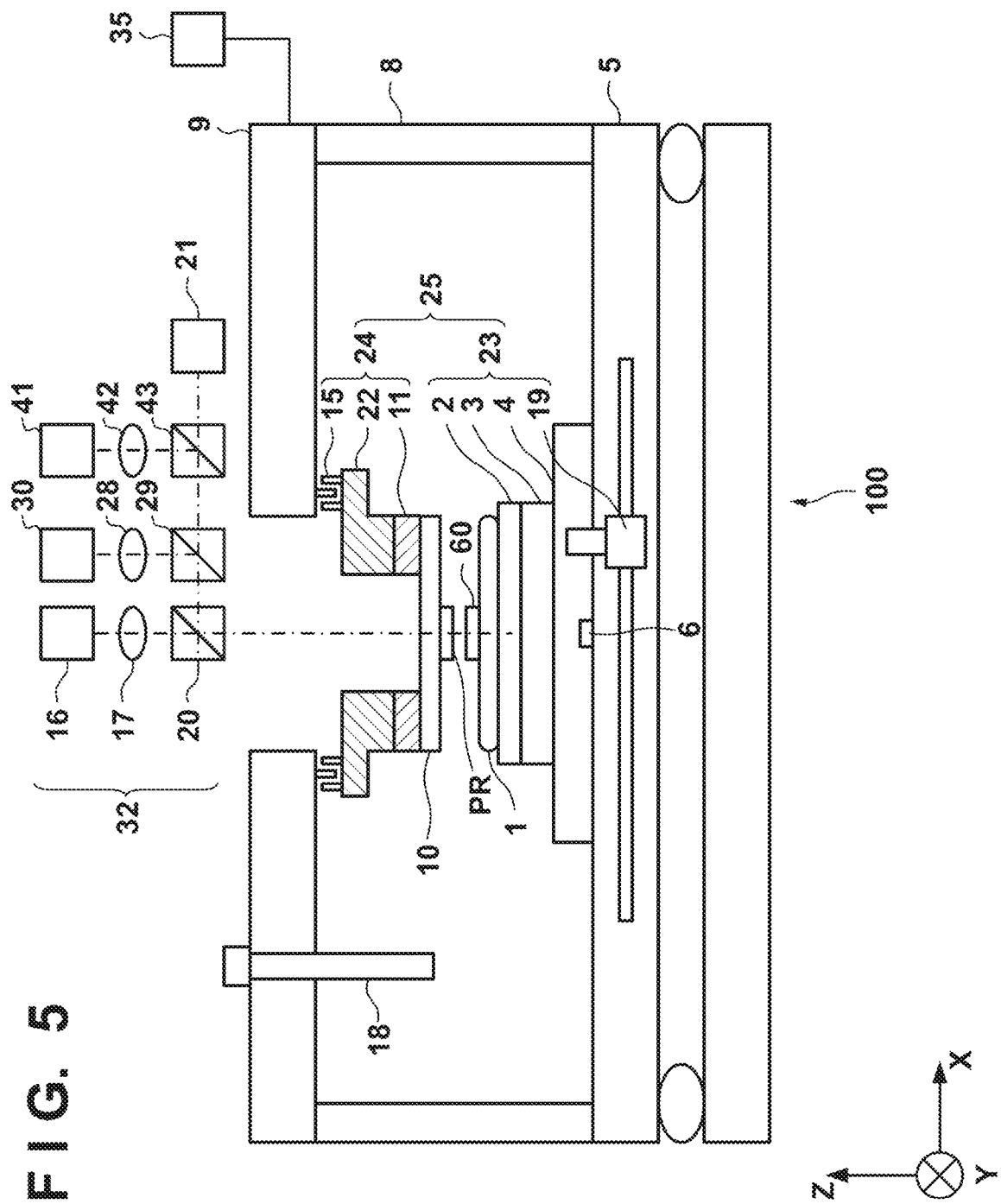
FIG. 5 is a view exemplarily showing the arrangement of an imprint apparatus according to the fourth embodiment of the present invention.

FIG. 5 shows the arrangement of an imprint apparatus 100 according to the fourth embodiment of the present invention. Matters not mentioned as the fourth embodiment can follow any one of the first to third embodiments. In the imprint apparatus 100 according to the fourth embodiment, a light irradiator 32 can include a third light source 41, a third optical system 42, and a third beam splitter 43. Light from the third light source 41 can be applied to an imprint material 60 on a substrate 1 and further the substrate 1 via, for example, the third optical system 42, the third beam splitter 43, a second beam splitter 29, and a first beam splitter 20. The third light source 41 can be used to perform light irradiation with respect to at least a part of the imprint material 60 so that the shape of the pattern formation target shot region of the substrate 1 is deformed into a target shape. In one example, the third light source 41 can generate light having a wavelength of 465 nm. Here, the second light source 30 generates light for increasing the viscoelasticity of the imprint material 60, and the third light source 41 generates light that deforms the shot region of the substrate 1. Therefore, the wavelengths of light generated by the light sources 30 and 40 can be different from each other.

Figure 6:
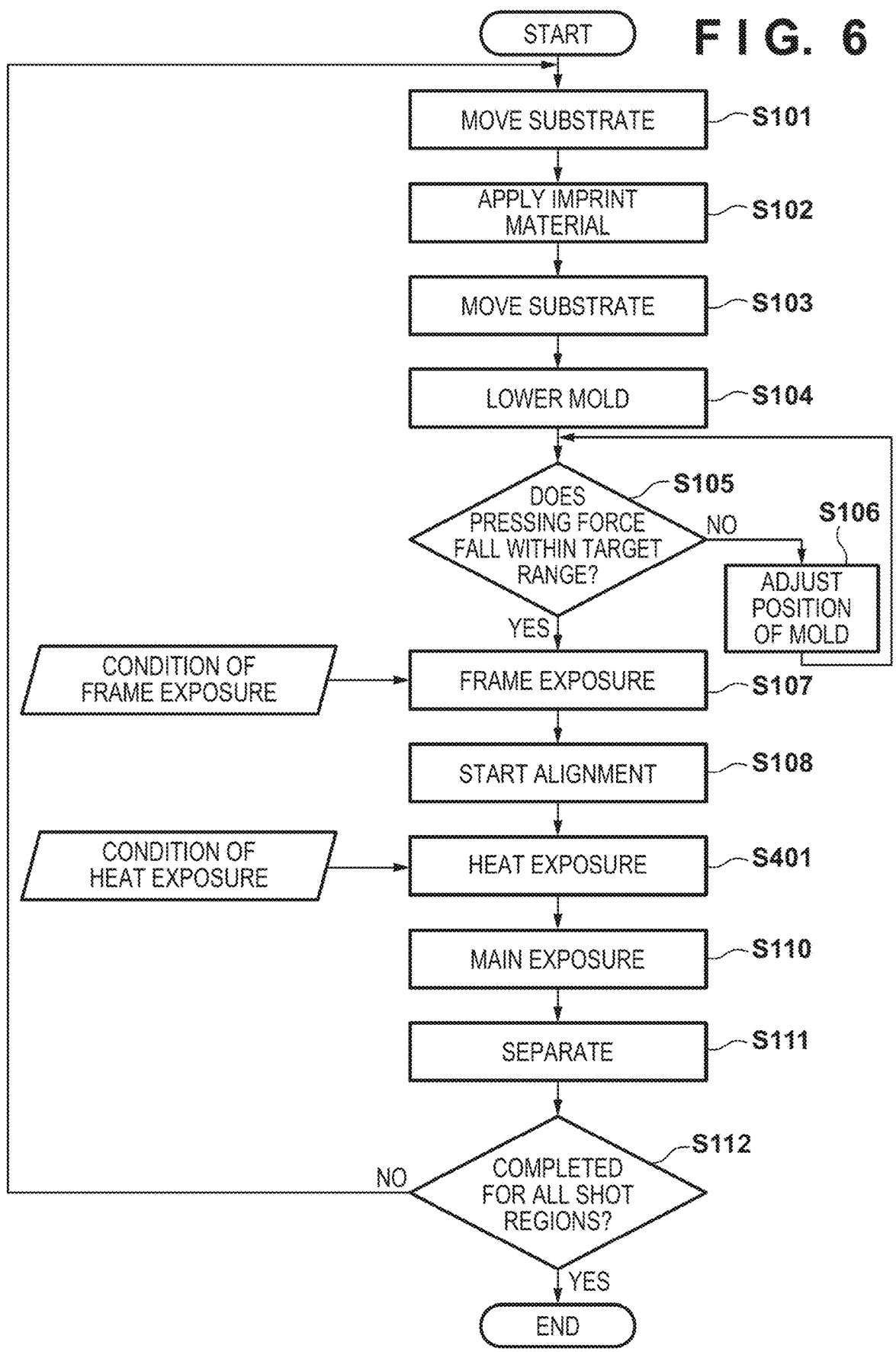
FIG. 6 is a view exemplarily showing the operation of the imprint apparatus according to the fourth embodiment of the present invention.

FIG. 6 exemplarily shows the operation of the imprint apparatus 100 according to the fourth embodiment of the present invention. The fourth embodiment is different from the first to third embodiments in that step S109 (second irradiation step; preliminary exposure) is replaced by step S401 (second irradiation step; heat exposure). However, step S401 may be added while leaving step S109.

Step S401 (second irradiation step; heat exposure) can be started, for example, at any timing after step S107 (first irradiation step; frame exposure) is started. In step S401, the controller 35 first determines the target shape of the pattern formation target shot region of the substrate 1 based on the relative position between the alignment mark on the substrate 1 and the alignment mark on the mold 10 obtained using an alignment scope (not shown). Further, in step S401, the controller 35 determines the irradiation amount distribution of light (light generated by the third light source 41) with respect to the substrate 1 for deforming the pattern formation target shot region into the target shape. Furthermore, in step S401, the controller 35 controls the light irradiator 32 so that the substrate 1 is irradiated with light via the imprint material 60 in accordance with the determined irradiation amount distribution. Step S401 (second irradiation step; heat exposure) can be performed such that the completion time is immediately before the start time of step S110 (third irradiation step; main exposure).

Figure 7:
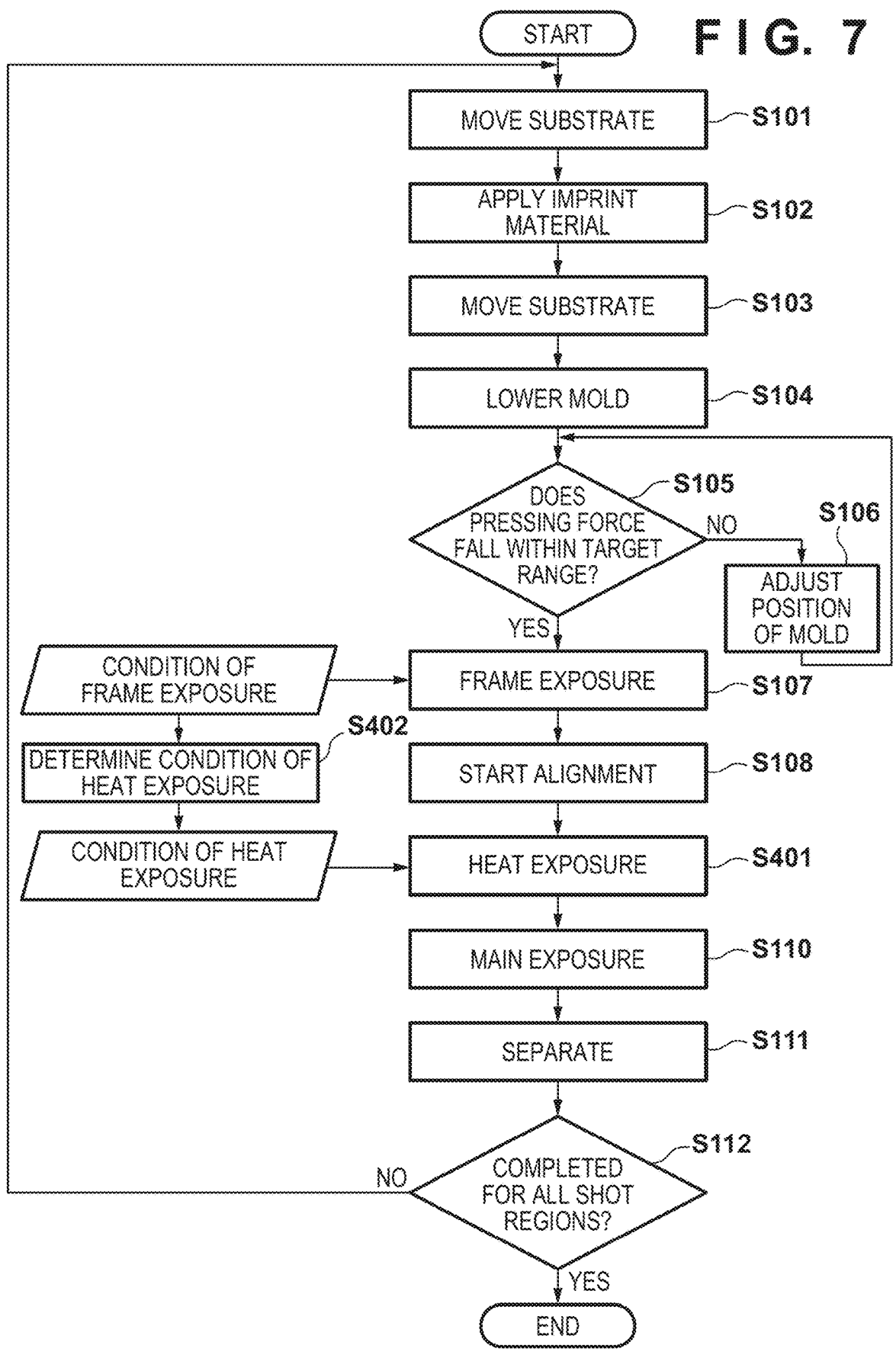
FIG. 7 is a view exemplarily showing the operation of an imprint apparatus according to the fifth embodiment of the present invention.

The fifth embodiment of the present invention will be described with reference to FIG. 7. Matters not mentioned as the fifth embodiment can follow the fourth embodiment. In the fifth embodiment, step S402 of determining the condition (heat exposure condition) in step S401 (second irradiation step; heat exposure) is added to the operation of the imprint apparatus 100 according to the fourth embodiment. FIG. 10A exemplarily shows a light irradiation amount distribution with respect to an imprint material 60 in step S401 (second irradiation step; heat exposure). For example, a controller 35 can determine the light irradiation amount distribution with respect to the imprint material 60 in step S401 (second irradiation step; heat exposure) based on the light irradiation amount distribution with respect to the imprint material 60 in step S107 (first irradiation step; frame exposure).

FIG. 10B schematically and exemplarily shows a method of determining, in step S201, the light irradiation amount distribution with respect to the imprint material in step S402 (second irradiation step; heat exposure). The controller 35 can determine the light irradiation amount distribution with respect to the imprint material in step S401 based on the target irradiation amount distribution at the time of completion of step S401 and the light irradiation amount distribution with respect to the imprint material in step S107. For example, the controller 35 can determine the light irradiation amount distribution with respect to the imprint material in step S401 based on the difference between the target irradiation amount distribution at the time of completion of step S401 and a distribution obtained by multiplying the light irradiation amount distribution with respect to the imprint material in step S107 by a coefficient.

Here, the light irradiation amount distribution $E_h(i, j)$ with respect to the imprint material in step S401 (second irradiation step; heat exposure) can be given by equation (2). $E_{href}(i, j)$ is the target irradiation amount distribution at the time of completion of step S401. $E_f(i, j)$ is the light irradiation amount distribution with respect to the imprint material in step S107 (first irradiation step: frame exposure). $\alpha(i, j)$ is a coefficient that takes into account that the effect of $E_f(i, j)$ on the shape of the shot region at the time of completion of step S401 decreases with time. (i, j) represents X- and Y-coordinates.

$$E_h(i,j) = E_{href}(i,j) - \alpha(i,j) \times E_f(i,j) \quad (2)$$

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
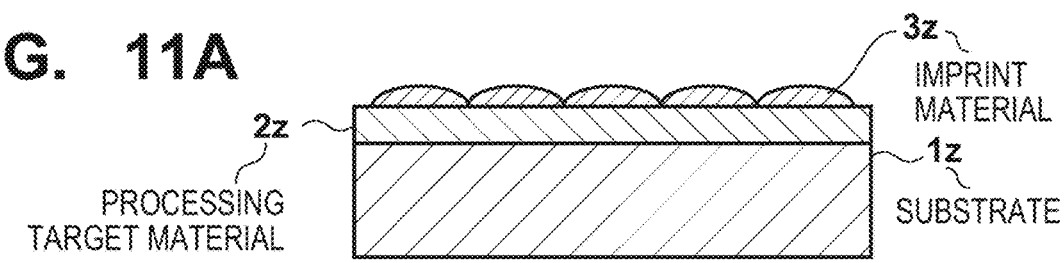
FIGS. 11A to 11F are views exemplarily showing an article manufacturing method.

An article manufacturing method of forming a pattern on a substrate by an imprint apparatus, processing the substrate on which the pattern has been formed, and manufacturing an article from the processed substrate will be described next. As shown in FIG. 11A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 11B:
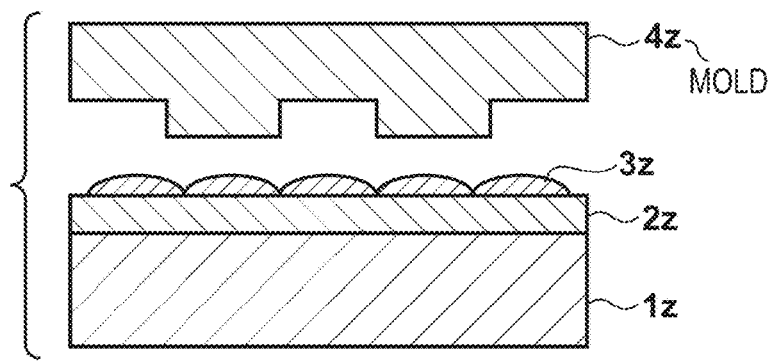
Figure 11C:
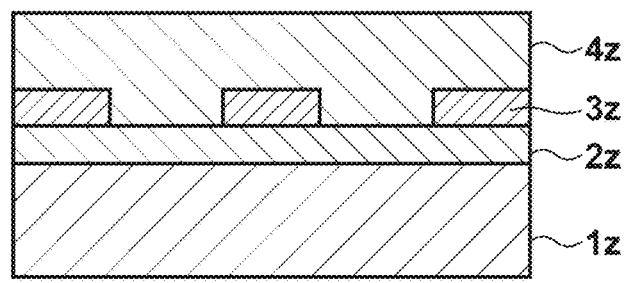

As shown in FIG. 11B, a side of a mold $4z$ for imprint with an uneven pattern is directed to and caused to face the imprint material $3z$ on the substrate. As shown in FIG. 11C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with energy for curing via the mold $4z$, the imprint material $3z$ is cured.

Figure 11D:
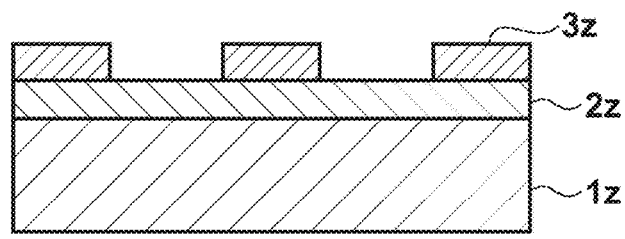

As shown in FIG. 11D, after the imprint material $3z$ is cured, the mold $4z$ is separated from the substrate $1z$. Then, the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the uneven pattern of the mold $4z$ is transferred to the imprint material $3z$.

Figure 11E:
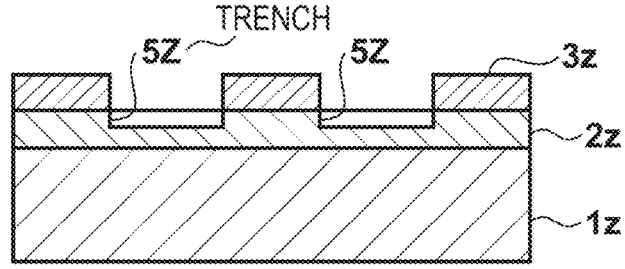
Figure 11F:
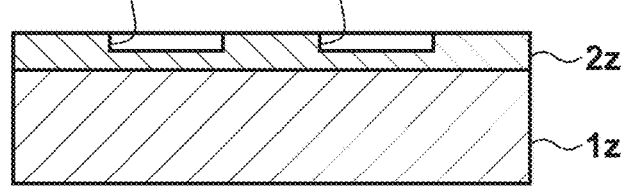

As shown in FIG. 11E, when etching is performed using the pattern of the cured product as an etching resistant mold, a portion of the surface of the processed material $2z$ where the cured product does not exist or remains thin is removed to form a groove $5z$. As shown in FIG. 11F, when the pattern of the cured product is removed, an article with the grooves $5z$ formed in the surface of the processed material $2z$ can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-232837, filed Dec. 12, 2018, which is hereby incorporated by reference herein in its entirety.

What is claimed is:

1. An imprint method comprising:
   a contact step of bringing an imprint material, on a shot region of a substrate, and a pattern region, of a mold, into contact with each other;
   an alignment step of aligning the shot region and the pattern region after the contact step;
   a first irradiation step of, before the alignment step is completed, irradiating only a frame-shaped portion of the imprint material on the shot region with light, the frame-shaped portion being located on a frame-shaped region formed by a peripheral region in the shot region and excluding a central portion of the shot region;
   a second irradiation step, started after the first irradiation step is started, irradiating at least a part of the imprint material on the shot region with light under a condition different from a condition in the first irradiation step so that an alignment error between the shot region and the pattern region is reduced; and
   a third irradiation step of irradiating the entire imprint material on the shot region with light after the alignment step is completed.

2. The method according to claim 1, wherein, in the second irradiation step, the at least a part of the imprint material is cured to a target hardness.

3. The method according to claim 1, wherein in the second irradiation step, the at least a part of the imprint material is cured to a target hardness so that a relative vibration between the substrate and the mold is reduced.

4. The method according to claim 2, wherein a light irradiation amount distribution with respect to the imprint material in the second irradiation step is determined based on a light irradiation amount distribution with respect to the imprint material in the first irradiation step.

5. The method according to claim 2, wherein a light irradiation amount distribution with respect to the imprint material in the second irradiation step is determined based on a target irradiation amount distribution at the time of completion of the second irradiation step and a light irradiation amount distribution with respect to the imprint material in the first irradiation step.

6. The method according to claim 2, wherein a light irradiation amount distribution with respect to the imprint material in the second irradiation step is determined based on a difference between a target irradiation amount distribution at the time of completion of the second irradiation step and a light irradiation amount distribution with respect to the imprint material in the first irradiation step.

7. The method according to claim 2, wherein a light irradiation amount distribution with respect to the imprint material in the third irradiation step is determined based on a light irradiation amount distribution in the first irradiation step and a light irradiation amount distribution in the second irradiation step.

8. The method according to claim 1, wherein, in the second irradiation step, the substrate is irradiated with light via the imprint material so that the shot region is deformed into a target shape.

9. The method according to claim 8, wherein a light irradiation amount distribution with respect to the substrate in the second irradiation step is determined based on a light irradiation amount distribution with respect to the imprint material in the first irradiation step.

10. The method according to claim 8, wherein a light irradiation amount distribution with respect to the substrate in the second irradiation step is determined based on a target irradiation amount distribution at the time of completion of the second irradiation step and a light irradiation amount distribution with respect to the imprint material in the first irradiation step.

11. The method according to claim 8, wherein a light irradiation amount distribution with respect to the substrate in the second irradiation step is determined based on a difference between a target irradiation amount distribution at the time of completion of the second irradiation step and a distribution obtained by multiplying a light irradiation amount distribution with respect to the imprint material in the first irradiation step by a coefficient.

12. The method according to claim 1, wherein light used in the first irradiation step and light used in the third irradiation step are different from each other in at least one of a wavelength band and an intensity distribution.

13. The method according to claim 1, wherein light used in the first irradiation step and light used in the second irradiation step have the same wavelength band.

14. The method according to claim 1, wherein the second irradiation step is started after the first irradiation step is completed.

15. An article manufacturing method comprising:
a pattern formation step of forming a pattern on a substrate using an imprint method defined in claim 1; and
a processing step of processing the substrate after the pattern formation step,
wherein an article is manufactured from the substrate.

* * * * *